(12) United States Patent
Roeckner et al.

(10) Patent No.: US 10,771,028 B2
(45) Date of Patent: Sep. 8, 2020

(54) PROGRAMMABLE GAIN AMPLIFIER APPARATUS AND METHOD

(71) Applicant: Futurewei Technologies, Inc., Plano, TX (US)

(72) Inventors: William Roeckner, Carpentersville, IL (US); Terrie McCain, Round Lake, IL (US); Matthew Richard Miller, Arlington Heights, IL (US); Lawrence E. Connell, Naperville, IL (US)

(73) Assignee: FutureWei Technologies, Inc., Plano, TX (US)

( * ) Notice: Subject to any disclaimer, the term of this patent is extended or adjusted under 35 U.S.C. 154(b) by 1 day.

(21) Appl. No.: 16/172,507

(22) Filed: Oct. 26, 2018

(65) Prior Publication Data

US 2019/0372538 A1 Dec. 5, 2019

Related U.S. Application Data

(60) Provisional application No. 62/677,352, filed on May 29, 2018.

(51) Int. Cl.
*H03F 1/02* (2006.01)
*H03F 3/45* (2006.01)
(Continued)

(52) U.S. Cl.
CPC ......... *H03F 3/45475* (2013.01); *H03F 3/005* (2013.01); *H03G 1/0094* (2013.01); *H03G 1/0088* (2013.01)

(58) Field of Classification Search
CPC ........ H03F 3/45475; H03F 3/005; H03F 3/72; H03F 1/0277; H03F 3/54; H03F 1/16;
(Continued)

(56) References Cited

U.S. PATENT DOCUMENTS 7,650,132 B2 * 1/2010 Darabi .................... H03F 1/223
330/254
8,170,150 B2 * 5/2012 Singh .................... H03K 5/135
330/253

(Continued)

FOREIGN PATENT DOCUMENTS

CN 101915932 A 12/2010
CN 103051298 A 4/2013

OTHER PUBLICATIONS

Borremans, Jonathan et al., "A 40 nm CMOS 0.4-6 GHz Receiver Resilient to Out-of-Band Blockers" IEEE Journal of Solid-State Circuits, vol. 46, No. 7, Jul. 2011, pp. 1659-1671.
(Continued)

*Primary Examiner* — Khanh V Nguyen
(74) *Attorney, Agent, or Firm* — Slater Matsil, LLP

(57) ABSTRACT

An apparatus comprises a plurality of selectable gain stages connected in parallel between a first bias voltage and ground, wherein each selectable gain stage comprises an amplification portion and a current steering portion, and wherein the current steering portion comprises a first selectable signal path connected between an output of the amplification portion and a signal output terminal, and a second selectable signal path connected between the output of the amplification portion and ground through a shunt device.

20 Claims, 10 Drawing Sheets

(51) Int. Cl.
*H03G 1/00* (2006.01)
*H03F 3/00* (2006.01)

(58) Field of Classification Search
CPC ........ H03F 3/602; H03F 1/0288; H03F 3/211; H03G 1/0094; H03G 1/0088; H01P 7/02
USPC ........ 330/9, 51, 53, 54, 55, 124 R, 295, 286
See application file for complete search history.

(56) References Cited

U.S. PATENT DOCUMENTS

| | | | |
|---|---|---|---|
| 9,941,852 B1* | 4/2018 | Abughazaleh | ....... H03G 1/0088 |
| 2016/0094193 A1 | 3/2016 | Kris et al. | |

OTHER PUBLICATIONS

Fan, Xiangning et al., "A Reconfigurable 0.7-2.6GHz Wideband Mixer for Multi-mode Multi-standard Receivers in 0.18μm RF CMOS" 2015 IEEE MTT-S International Microwave Workshop Series on Advanced Materials and Processes for RF and THz Applications (IMWS-AMP), 2015, 3 pages.

Kaczman, Daniel et al., "A Single-Chip 10-Band WCDMA/HSDPA 4-Band GSM/EDGE SAW-less CMOS Receiver With DigRF 3G Interface and +90 dBm IIP2" IEEE Journal of Solid-State Circuits, vol. 44, No. 3, Mar. 2009, pp. 718-739.

* cited by examiner

PROGRAMMABLE GAIN AMPLIFIER APPARATUS AND METHOD

CROSS REFERENCE TO RELATED APPLICATIONS

This application is related to, and claims priority to U.S. Provisional Application No. 62/677,352, titled, "Programmable Gain Amplifier Apparatus and Method" filed on May 29, 2018, which is herein incorporated by reference.

TECHNICAL FIELD

The present disclosure relates to a radio frequency front-end amplifier, and more particularly to a programmable gain amplifier apparatus for adjusting the gain of the radio frequency front-end amplifier under different operating conditions.

BACKGROUND

Wireless communication systems are widely used to provide voice and data services for multiple users using a variety of access terminals such as cellular telephones, laptop computers and various multimedia devices. Such communications systems can encompass local area networks, such as IEEE 801.11 networks, cellular telephone and/or mobile broadband networks. The communication system can use one or more multiple access techniques, such as Frequency Division Multiple Access (FDMA), Time Division Multiple Access (TDMA), Code Division Multiple Access (CDMA), Orthogonal Frequency Division Multiple Access (OFDMA), Single Carrier Frequency Division Multiple Access (SC-FDMA) and others. Mobile broadband networks can conform to a number of standards such as the main $2^{nd}$-Generation (2G) technology Global System for Mobile Communications (GSM), the main $3^{rd}$-Generation (3G) technology Universal Mobile Telecommunications System (UMTS), the main $4^{th}$-Generation (4G) technology Long Term Evolution (LTE) and emerging $5^{th}$-Generation (5G) technologies.

A wireless network may include a wireless device and a plurality of base stations. The wireless device may be a notebook computer, a mobile phone or a Personal Digital Assistant (PDA), a media player, a gaming device or the like. The base stations communicate with the wireless device over a plurality of wireless channels coupled between the wireless device and the base stations (e.g., a downlink channel from a base station to a wireless device). The wireless device may send back information, including channel information, to the base stations over a plurality of feedback channels (e.g., an uplink channel from the wireless device to the base station).

The wireless device may include a transceiver coupled between an antenna and a baseband processor. The transceiver may comprise an amplifier and a first mixer coupled to a local oscillator. The amplifier is employed to convert a radio frequency voltage signal to a radio frequency current signal. The first mixer receives the signal from the amplifier and generates a signal at an intermediate frequency suitable for the baseband processor. After being processed by the first mixer, an in-phase (I) signal having the intermediate frequency is generated and sent to the baseband processor.

The transceiver further comprises a second mixer coupled to the local oscillator through a phase shifter. The phase shifter adds a 90 degree phase shift to the signal generated by the local oscillator. The second mixer generates a quadrature (Q) signal for digital signal processing in the baseband processor.

The wireless device often includes a front-end transconductance amplifier converting an input radio frequency voltage signal to a radio frequency current signal for driving the mixers. Programmable gain amplifiers are required to adjust the signal range so as to generate a suitable radio frequency current signal for the downstream devices.

It would be desirable to have a high performance amplifier exhibiting good behaviors such as high linearity, good compression performance, good gain step accuracy, low input impedance variations and the like under a variety of operating conditions.

SUMMARY OF THE INVENTION

These and other problems are generally solved or circumvented, and technical advantages are generally achieved, by preferred embodiments of the present disclosure which provide a system, apparatus and method for adjusting a gain of a radio frequency front-end amplifier under different operating conditions.

In accordance with an embodiment, an apparatus comprises a plurality of gain stages connected in parallel between a first bias voltage and ground, wherein each gain stage comprises an amplification portion and a current steering portion, and wherein the current steering portion comprises a first selectable signal path connected between an output of the amplification portion and a signal output terminal, and a second selectable signal path connected between the output of the amplification portion and ground through a shunt device.

In accordance with another embodiment, a system comprises an inverting phase path comprising a plurality of first gain stages connected in parallel between a first voltage and a second voltage, wherein each first gain stage comprises a first amplification portion and a first current steering portion, and wherein the first current steering portion sends an output signal of the first amplification portion to either a first output signal path or ground through a shunt device and a non-inverting phase path comprising a plurality of second gain stages connected in parallel between the first voltage and the second voltage, wherein each second gain stage comprises a second amplification portion and a second current steering portion, and wherein the second current steering portion sends an output signal of the second amplification portion to either a second output signal path or ground through the shunt device.

In accordance with yet another embodiment, a method comprises receiving a radio frequency signal by an amplifier, wherein the amplifier comprises a plurality of amplification portions connected in parallel and a plurality of current steering portions connected to their corresponding amplification portions, respectively, increasing a gain of the amplifier by turning on a first switch of a current steering portion and turning off a second switch of the current steering portion, wherein the first switch is coupled to an output of the amplifier and the second switch is coupled to ground and reducing the gain of the amplifier by turning off the first switch of the current steering portion and turning on the second switch of the current steering portion.

An advantage of a preferred embodiment of the present disclosure is adjusting a gain of a radio frequency front-end amplifier under different operating conditions.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Embodiments of the present disclosure are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

The present disclosure will be described with respect to preferred embodiments in a specific context, namely a programmable gain amplifier apparatus for a cellular radio frequency receiver. The invention may also be applied, however, to a variety of radio frequency devices. Hereinafter, various embodiments will be explained in detail with reference to the accompanying drawings.

Figure 1:
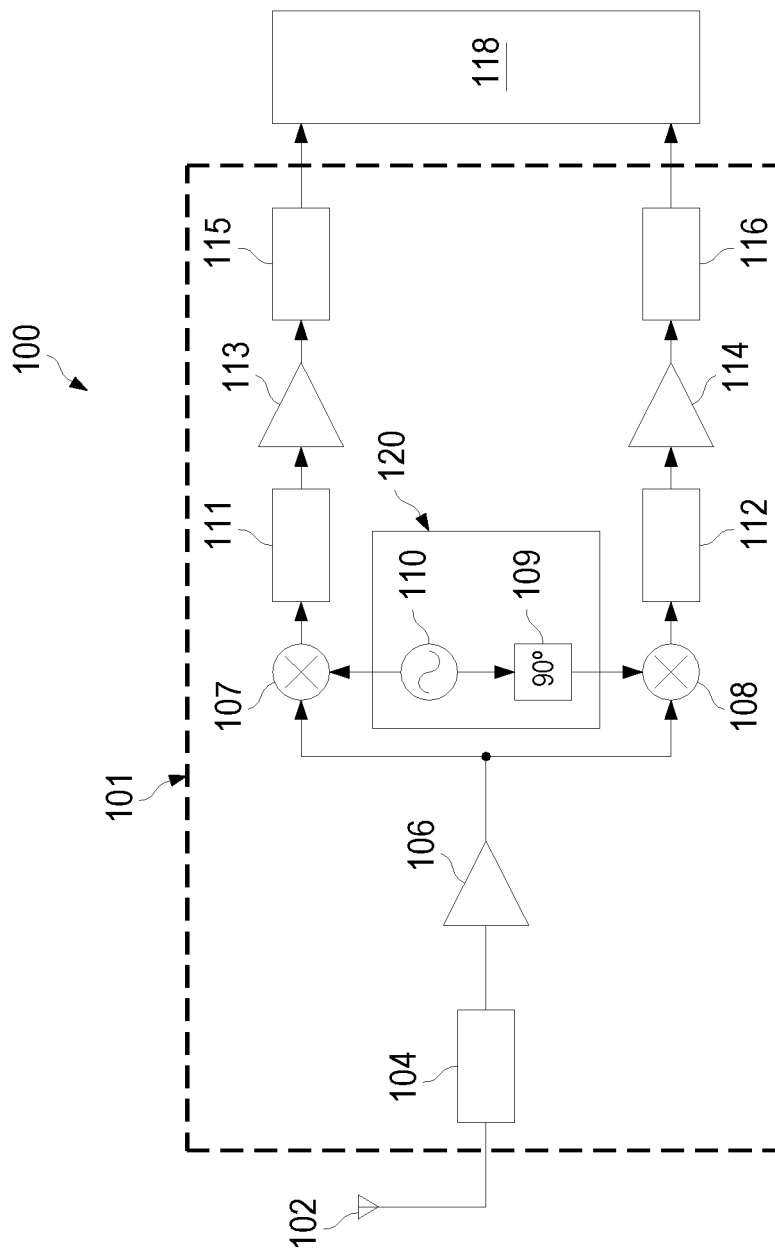
FIG. 1 illustrates a block diagram of a mobile device in accordance with various embodiments of the present disclosure.

FIG. 1 illustrates a block diagram of a mobile device in accordance with various embodiments of the present disclosure. The mobile device 100 may be a notebook computer, a mobile phone or a Personal Digital Assistant (PDA), a media player, a gaming device and/or the like. In some embodiments, the mobile device 100 may comprise a receiver 101, a transmitter, antennas and other suitable components. Alternatively, the mobile device may comprise a transceiver in which both a transmitter and a receiver are combined and share common circuitry. For simplicity, only the detailed block diagram of the receiver 101 is shown in FIG. 1.

The receiver 101 is coupled between an antenna 102 and a baseband processor 118. While FIG. 1 shows a single antenna, the antenna 102 may include two or more antennas, for example, a primary antenna and one or more secondary antennas that may be used for transmitting and receiving wireless communication signals. Typically, the primary antenna is configured to receive inbound wireless signals from the base station or transmit outbound wireless signals from the mobile device to a base station. The secondary antenna, as an auxiliary antenna, may not be able to receive/transmit high performance outbound signals from the mobile device to the base station. The main function of the secondary antenna is receiving diversity wireless signals. A mobile device having two antennas is well known in the art, and hence is not discussed in further detail herein to avoid repetition.

The mobile device 100 may transmit and receive wireless signals modulated based upon various standards such as the main $2^{nd}$-Generation (2G) technology Global System for Mobile Communications (GSM), the main $3^{rd}$-Generation (3G) technology Universal Mobile Telecommunications System (UMTS), the main $4^{th}$-Generation (4G) technology Long Term Evolution (LTE) and emerging $5^{th}$-Generation (5G) technologies. In addition, the wireless signals may be modulated based upon other standards such as Worldwide Interoperability for Microwave Access (WiMAX), Wireless Local Area Network (WLAN), Ultra Wideband (UWB) and the like.

The processor 118 may be any suitable baseband processors such as a digital signal processor (DSP) chip and/or the like. The processor 118 is employed to manage radio frequency functions and provide control software for radio communication. The processor 118 may be further coupled to other mobile device function units such as an application processor and/or the like.

As shown in FIG. 1, the receiver 101 may comprise a plurality of filters such as a first filter 104, an I-channel filter 111 and a Q-channel filter 112. The receiver 101 may further comprise a plurality of gain stages such as an amplifier 106, an I-channel amplifier 113 and a Q-channel amplifier 114. In order to provide digital signals suitable for the processor 118, a plurality of analog-to-digital (A/D) converters 115 and 116 are employed as shown in FIG. 1. The functions of the filters, I and Q channel amplifiers and A/D converters described above are well known, and hence are not discussed in further detail herein.

The amplifier 106 is employed to convert an input radio frequency voltage signal to a radio frequency current signal for driving the mixers (e.g., mixers 107 and 108). In some embodiments, the amplifier 106 is implemented as a programmable gain amplifier. In other words, the amplifier 106 is not a fixed gain amplifier. Instead, the gain of the amplifier 106 can be dynamically adjusted based upon different operating conditions.

In some embodiments, the amplifier 106 is a radio frequency complementary metal-oxide-semiconductor (CMOS) transconductance (gm) amplifier with a programmable gain. The programmable gain may be implemented using a plurality of segmented CMOS transconductance gain stages with a plurality of current steering switches placed at the outputs of the plurality of segmented CMOS transconductance gain stages. The plurality of current steering switches is configured to provide two output signal paths. In particular, two current steering switches are connected to an output of each segmented CMOS transconductance gain stage. A first current steering switch is coupled between the output of the gain stage and an output of the amplifier 106. A second current steering switch is coupled between the output of the gain stage and ground. These two current steering switches are controlled by two complementary drive signals.

In operation, the output current of the gain stage is sent to the output of the amplifier 106 if the first current steering switch is turned on and the second current steering switch is turned off. Under this current steering switch on/off configuration, the gain stage is configured as an on segment. On the other hand, the output current of the gain stage is dumped to ground through a shunt capacitor if the first current steering switch is turned off and the second current steering switch is turned on. Under this current steering switch on/off configuration, the gain stage is configured as an off segment.

In operation, the output signal currents from all on segments are summed at the output of the amplifier 106. The output signal currents from all off segments are summed together and dumped into ground through the shunt capacitor. By controlling the number of the output currents flowing from the on segments, the gain of the amplifier 106 can be adjusted accordingly. The detailed structure of the amplifier 106 will be described below with respect to FIGS. 2-6. Throughout the description, the amplifier 106 is alternatively referred to as a programmable gain amplifier.

The receiver 101 comprises a signal generator 120. As shown in FIG. 1, the signal generator 120 comprises a local oscillator 110 and a phase shifter 109. The local oscillator 110 generates a signal at a frequency suitable for driving the mixer which then translates a radio frequency input signal to an intermediate frequency suitable for the processor 118. FIG. 1 further illustrates a first mixer 107 coupled to the local oscillator 110. In some embodiments, the signal generated by the local oscillator 110 is a 25% duty cycle signal. After being processed by the first mixer 107, an in-phase (I) signal having the intermediate frequency is generated and sent to the processor 118.

Likewise, a second mixer 108 is coupled to the local oscillator 110 through the phase shifter 109. The phase shifter 109 adds a 90 degree phase shift to the signal generated by the local oscillator 110. The second mixer 108 generates a quadrature (Q) signal for digital signal processing in the processor 118.

Throughout the description, the channel the in-phase signal passes through is alternatively referred to as an I-channel of the receiver 101. Likewise, the channel the quadrature signal passes through is alternatively referred to as a Q-channel of the receiver 101. As shown in FIG. 1, the I-channel and the Q-channel may be of a same configuration.

Figure 2:
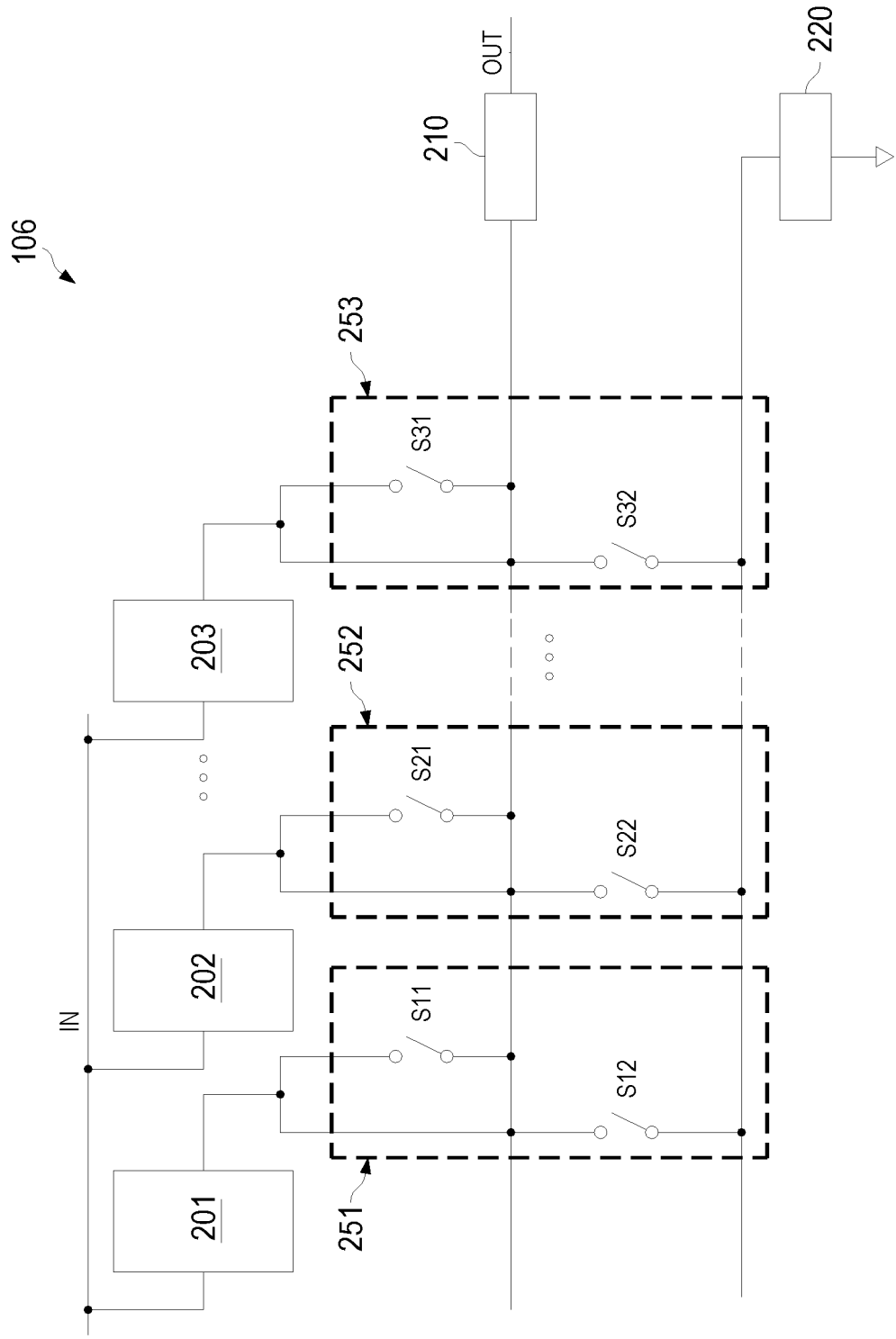
FIG. 2 illustrates a block diagram of the programmable gain amplifier shown in FIG. 1 in accordance with various embodiments of the present disclosure.

FIG. 2 illustrates a block diagram of the programmable gain amplifier shown in FIG. 1 in accordance with various embodiments of the present disclosure. The programmable gain amplifier 106 comprises a plurality of gain stages connected in parallel. Each gain stage comprises an amplification portion and a current steering portion. As shown in FIG. 2, a first gain stage comprises a first amplification portion 201 and a first current steering portion 251. The first amplification portion 201 may be implemented as a CMOS transconductance amplifier. The first current steering portion 251 comprises a first current steering switch S11 and a second current steering switch S12.

As shown in FIG. 2, the first current steering switch S11 is connected between the output of the first amplification portion 201 and the output of the programmable gain amplifier 106. Depending on design needs and different application, an ac coupling apparatus 210 may be placed between the first current steering switch S11 and the output of the programmable gain amplifier 106. In some embodiments, the ac coupling apparatus 210 is implemented as an ac coupling capacitor.

The second current steering switch S12 is connected between the output of the first amplification portion 201 and ground through a shunt apparatus 220. In some embodiments, the shunt apparatus 220 is implemented as a shunt capacitor.

The programmable gain amplifier 106 further comprises a second gain stage and a third gain stage. As shown in FIG. 2, a second gain stage comprises a second amplification portion 202 and a second current steering portion 252. The second current steering portion 252 comprises a third current steering switch S21 and a fourth current steering switch S22. The third gain stage comprises a third amplification portion 203 and a third current steering portion 253. The third current steering portion 253 comprises a fifth current steering switch S31 and a sixth current steering switch S32. The structures of the second gain stage and the third gain stage are similar to that of the first gain stage, and hence are not discussed in further detail to avoid repetition.

In some embodiments, the amplification portions of FIG. 2 are implemented as a plurality of binary-weighted amplification portions connected in parallel. The plurality of binary-weighted amplification portions has gain values corresponding to a number of binary bits having a range from a least significant bit to a most significant bit. For example, the gains of the amplification portions 201, 202 and 203 have a ratio of 4:2:1 in accordance with one embodiment.

It is understood that the programmable gain amplifier 106 may employ any number of gain stages. Three gain stages in FIG. 2 are illustrated for simplicity. Depending on different applications and design needs, a person skilled in the art would understand the number of gain stages may vary accordingly.

As shown in FIG. 2, two switches (e.g., S11 and S12) are connected to the output of each amplification portion (e.g., amplification portion 201). More particularly, a turned-on first switch (e.g., S11) allows the output current of the amplification portion (e.g., amplification portion 201) to flow from the amplification portion to the output of the amplifier 106. A turned-on second switch (e.g., S12) directs the output current of the amplification portion (e.g., amplification portion 201) to ground through the shunt apparatus 220.

In some embodiments, the current steering switches of FIG. 2 may be implemented as a plurality of binary-weighted current steering switches connected to their corresponding binary-weighted amplification portions, respectively. For example, current steering switches S11 and S12 form a first current steering portion. Current steering switches S21 and S22 form a second current steering portion. Current steering switches S31 and S32 form a third current steering portion. These three current steering portions are binary-weighted current steering portions. In other words, the current steering capability of each of these three current steering portions is proportional to a gain of its corresponding binary-weighted amplification portion. It should be understood that the actuation of switches that steer current, such as S11, S21, S31, S12, S22 and S32 as shown in FIG. 2 may be controlled by a control signal (not shown in FIG. 2) produced by a controller, a processor, or other suitable logic circuits. If, for example, each of the switches is a switch configured transistor, the control signal would be a voltage that actuates the switch into the desired mode of operation (either on or off).

In operation, only one of the two current steering switches associated with each amplification portion can be on at the same time. If a first current steering switch of an amplification portion is turned on, the output current from the amplification portion is summed to the output of the programmable gain amplifier 106, thereby increasing the amplitude of the output signal of the programmable gain amplifier 106. On the other hand, if the second current steering switch of the amplification portion is turned on, the output current from the amplification portion is dumped to ground through the shunt apparatus 220, thereby reducing the amplitude of the output signal of the programmable gain amplifier 106. As a result, the gain of the programmable gain amplifier 106 can be dynamically adjusted through configuring the on/off of the current steering switches shown in FIG. 2.

One advantageous feature of having the current steering portions shown in FIG. 2 is, by placing the current steering switches in the output paths, the current steering switches only handle output signal currents. No current steering switches are placed in the main high current paths. This current steering switch configuration allows maximum headroom for the CMOS transistors of the amplification portions, thereby resulting in maximum linearity performance and high compression.

Another advantageous feature of having the current steering portions shown in FIG. 2 is during the gain adjustment process, the amplification portions keep operating, thereby maintaining the same input impedance or low input impedance variations at the input of the amplifier 106.

Figure 3:
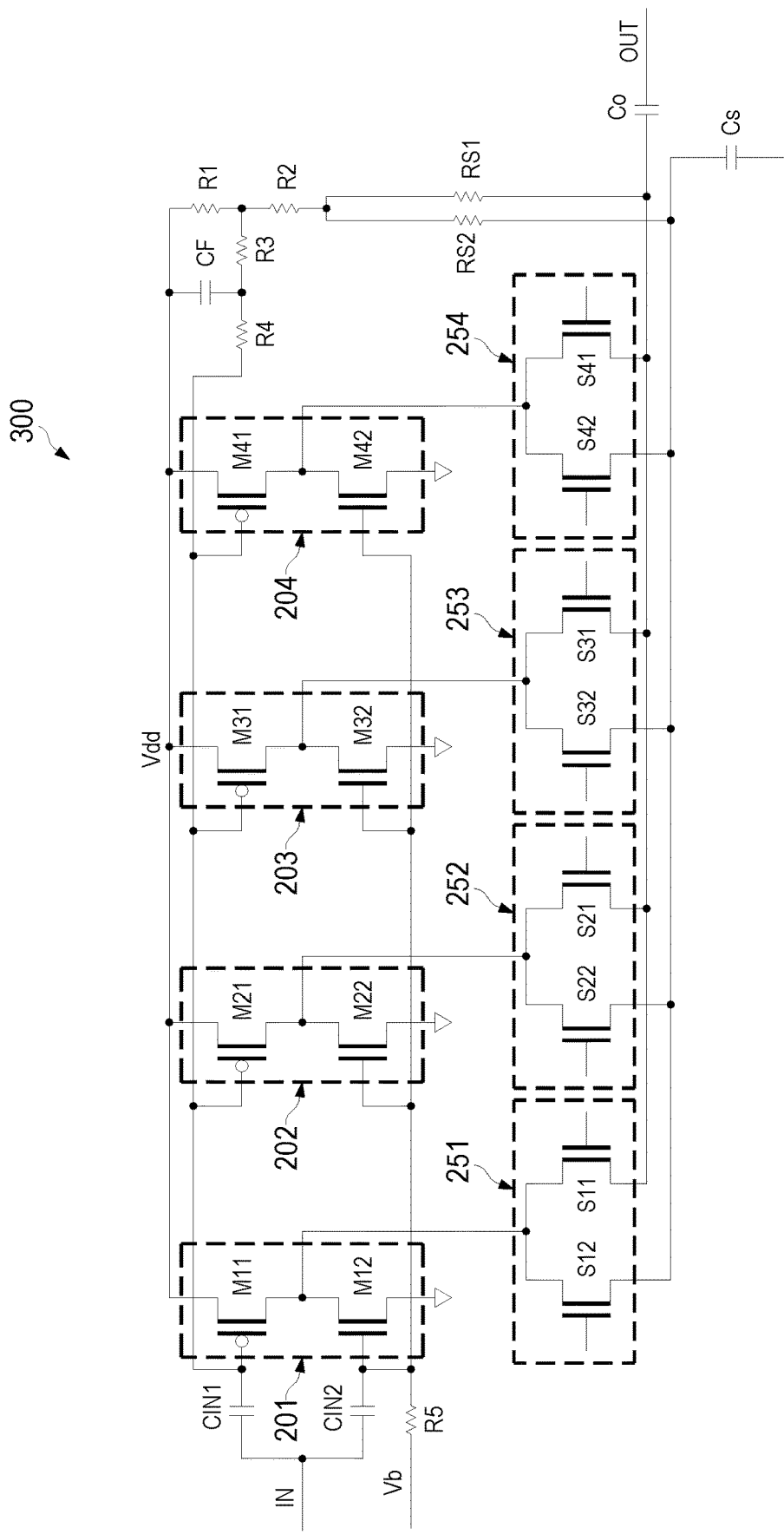
FIG. 3 illustrates a schematic diagram of a first implementation of the programmable gain amplifier shown in FIG. 1 in accordance with various embodiments of the present disclosure.

FIG. 3 illustrates a schematic diagram of a first implementation of the programmable gain amplifier shown in FIG. 1 in accordance with various embodiments of the present disclosure. The programmable gain amplifier 300 includes four gain stages connected in parallel. A first gain stage comprises a first amplification portion 201 and a first current steering portion 251. A second gain stage comprises a second amplification portion 202 and a second current steering portion 252. A third gain stage comprises a third amplification portion 203 and a third current steering portion 253. A fourth gain stage comprises a fourth amplification portion 204 and a fourth current steering portion 254.

The first amplification portion 201 comprises a first transistor M11 and a second transistor M12 connected in series between a first bias voltage Vdd and ground. In some embodiments, the first transistor M11 is a p-type transistor. The second transistor M12 is an n-type transistor. The gate of the first transistor M11 and the gate of the second transistor M12 are connected to a signal input terminal of the programmable gain amplifier 300 through a first input capacitor CIN1 and a second input capacitor CIN2, respectively. The first input capacitor CIN1 and the second input capacitor CIN2 function as input dc blocking capacitors according to some embodiments.

It should be noted that the first amplification portion 201 used in FIG. 3 is selected purely for demonstration purposes and is not intended to limit the various embodiments of the present invention to any type of amplification portion. One of ordinary skill in the art would recognize many variations, alternatives, and modifications. For example, the first amplification portion 201 may be replaced by a plurality of amplification portions connected in parallel.

The first current steering portion 251 comprises a first current steering switch S11 and a second current steering switch S12. In some embodiments, the first current steering switch S11 is implemented as a first n-type transistor such as a first metal oxide semiconductor field effect transistor (MOSFET). The second current steering switch S12 is implemented as a second n-type transistor such as a second MOSFET. In alternative embodiments, depending on different applications and design needs, the current steering switches S11 and S12 may be implemented as other suitable switching elements such as bipolar junction transistor (BJT) devices, super junction transistor (SJT) devices, bipolar transistors and/or the like. A first drain/source terminal of the first current steering switch S11 and a first drain/source terminal of the second current steering switch S12 are connected together and further connected to a common node of the first transistor M11 and the second transistor M12. The common node of the first transistor M11 and the second transistor M12 is the output of the first amplification portion 201.

A second drain/source terminal of the first current steering switch S11 is connected to the output of the programmable gain amplifier 300 through an output capacitor Co. The output capacitor Co is an ac coupling capacitor. A second drain/source terminal of the second current steering switch S12 is connected to ground through a shunt capacitor Cs. In some embodiments, the first current steering switch S11 and the second current steering switch S12 are implemented as n-type transistors. In some embodiments, the first drain/source terminal is a drain and the second drain/source terminal is a source. The gates of the first current steering switch S11 and the second current steering switch S12 are driven by two complementary gate drive signals.

The second amplification portion 202 comprises a third transistor M21 and a fourth transistor M22 connected in series between the first bias voltage Vdd and ground. The third amplification portion 203 comprises a fifth transistor M31 and a sixth transistor M32 connected in series between the first bias voltage Vdd and ground. The fourth amplification portion 204 comprises a seventh transistor M41 and an eighth transistor M42 connected in series between the first bias voltage Vdd and ground. The structures of the amplification portions 202, 203 and 204 are similar to that of the first amplification portion 201, and hence are not discussed herein to avoid repetition.

The second current steering portion 252 comprises a third current steering switch S21 and a fourth current steering switch S22. The third current steering portion 253 comprises a fifth current steering switch S31 and a sixth current steering switch S32. The fourth current steering portion 254 comprises a seventh current steering switch S41 and an eighth current steering switch S42. The structures of the current steering portions 252, 253 and 254 are similar to that of the first current steering portion 251, and hence are not discussed herein to avoid repetition.

The programmable gain amplifier 300 further comprises a first biasing circuit, a second biasing circuit and a filter circuit. The first biasing circuit comprises a first resistor R1, a second resistor R2, a first sense resistor RS1 and a second sense resistor RS2. The first resistor R1 and the second resistor R2 form a resistor divider. As shown in FIG. 3, the common node of the first resistor R1 and the second resistor R2 is coupled to the gates of the p-type transistors through resistors R3 and R4. The resistor divider is used to provide the dc bias for all of the gates of the p-type transistors M11, M21, M31 and M41. More particularly, the first bias voltage Vdd and the resistor divider are used to set up a bias point at the output of the programmable gain amplifier 300.

Furthermore, the resistor divider, the first sense resistor RS1 and the second sense resistor RS2 are employed to set the dc bias at the output of the programmable gain amplifier 300. As shown in FIG. 3, the second resistor R2 is coupled to both the output capacitor Co and the shunt capacitor Cs through the sense resistors RS1 and RS2, respectively. One advantageous feature of having this bias configuration is the bias circuit provides a similar dc bias to the output nodes of all gain stages independent of whether they are switched to the output of the amplifier 300 or switched to the shunt capacitor.

A second biasing circuit comprises a resistor R5 connected between a second bias voltage Vb and the gates of the n-type transistors of the amplification portions (e.g., n-type transistors M12, M22, M32 and M42). The second biasing circuit is employed to provide the dc bias for all of the gates of the n-type transistors.

The filter circuit is formed by the first resistor R1, the second resistor R2, a third resistor R3 and a capacitor CF. The common node between R3 and R4 is coupled to ac ground through the capacitor CF. The capacitor CF in conjunction with resistors R1, R2 and R3 provides a low pass filtering function for filtering undesired noise from the n-type transistors associated with the amplification portions. The resistor R4 is employed to provide isolation between the filter circuit and the p-type transistors.

In some embodiments, the first resistor R1 is a 140 Kohm resistor. The second resistor R2 is a 125 Kohm resistor. The third resistor R3 is a 90 Kohm resistor. The fourth resistor R4 is a 5 Kohm resistor. The fifth resistor R5 is a 100 Kohm resistor. The first sense resistor RS1 is a 3 Kohm resistor. The second sense resistor RS2 is a 3 Kohm resistor. The resistors R1, R2, R3, R4 and R4 can be implemented as traditional resistors. Alternatively, the resistors R1, R2, R3, R4 and R4 can be formed by transistors. It is well known that a transistor can be configured to act as a resistor.

It should be noted that the resistor values above are selected purely for demonstration purposes and are not intended to limit the various embodiments of the present disclosure to any particular resistor values.

In some embodiments, the shunt capacitor Cs is a 10 pF capacitor. The capacitor Co is a 10 pF capacitor. The first input capacitor CIN1 is a 3 pF capacitor. The second input capacitor CIN2 is a 3 pF capacitor. The capacitance of the filter capacitor CF is in a range from about 5 pF to about 10 pF.

It should be noted that the capacitor values above are selected purely for demonstration purposes and are not intended to limit the various embodiments of the present disclosure to any particular capacitor values.

In some embodiments, the first bias voltage Vdd is about 1.2 V. The second bias voltage Vb is about 300 mV. It should be noted that the bias voltages above are selected purely for demonstration purposes and are not intended to limit the various embodiments of the present disclosure to any particular bias voltages. Both the first bias voltage and the second bias voltage may vary in response to different fabrication processes.

One advantageous feature of having the biasing circuits shown in FIG. 3 is the biasing circuitry is minimized by implementing a single biasing network that is shared by all segments, thereby reducing the die area and cost of the programmable gain amplifier 300.

Furthermore, the current steering switch in series with the shunt capacitor provides a low impedance path for the current output signal of each off segment. This low impedance path minimizes the voltage swing at the output of each off segment. A small voltage swing at the off segment output node minimizes undesired parasitic signals coupling to the amplifier output through the off switch, resulting in greater gain step accuracy.

Figure 4:
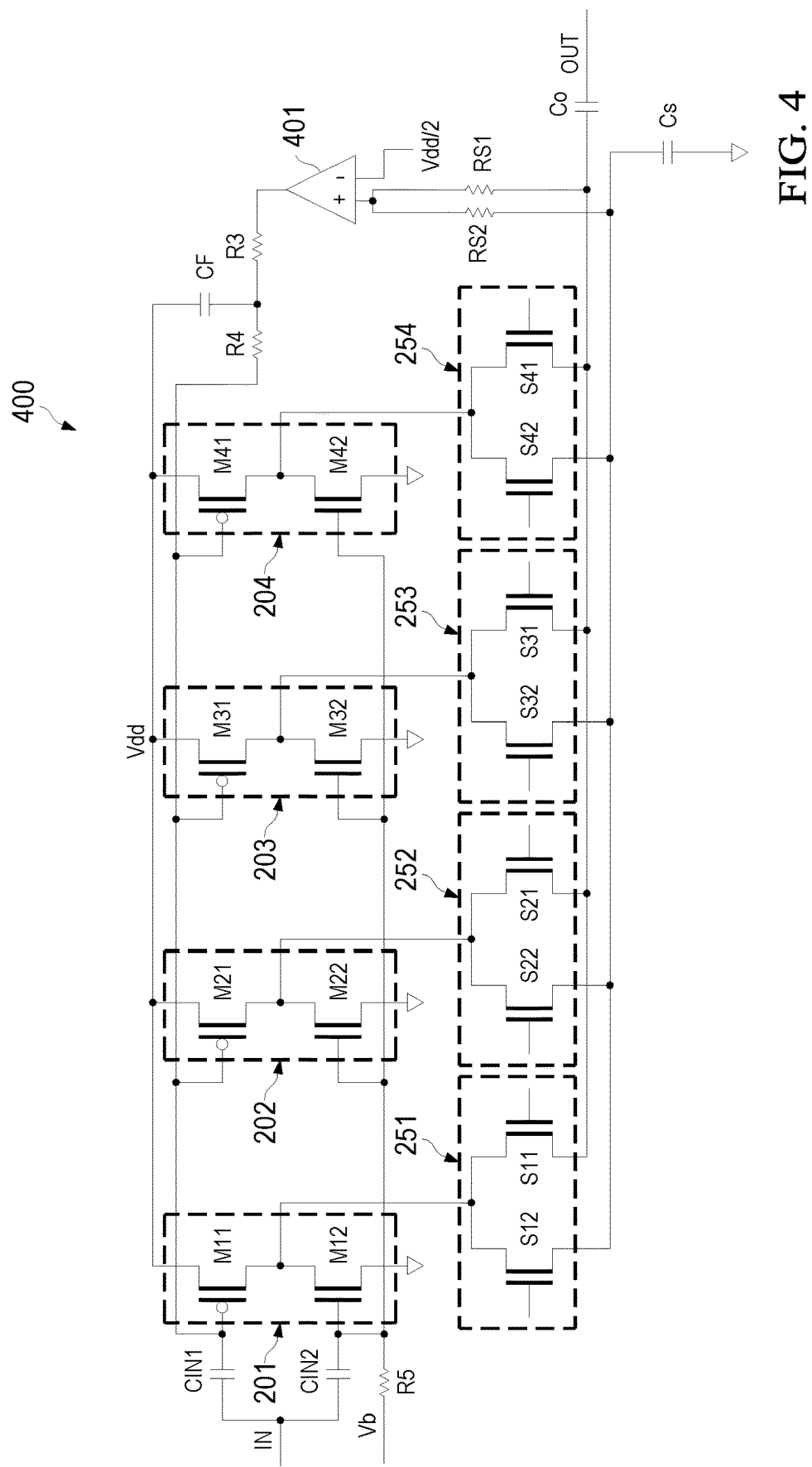
FIG. 4 illustrates a schematic diagram of a second implementation of the programmable gain amplifier shown in FIG. 1 in accordance with various embodiments of the present disclosure.

FIG. 4 illustrates a schematic diagram of a second implementation of the programmable gain amplifier shown in FIG. 1 in accordance with various embodiments of the present disclosure. The schematic diagram of the second implementation of the programmable gain amplifier 400 is similar to that shown in FIG. 3 except that the resistor divider shown in FIG. 3 has been replaced by a feedback amplifier 401.

A non-inverting input terminal of the feedback amplifier 401 is connected to the common node of the two sense resistors RS1 and RS2. The inverting input terminal of the feedback amplifier 401 is connected to a predetermined voltage reference which sets the dc bias of the amplification portions. In some embodiments, the predetermined voltage reference is equal to one half of the bias voltage Vdd. This bias circuit shown in FIG. 4 allows less bias voltage variations over different fabrication processes and operating conditions. The filter formed by R3 and CF may form a pole for achieving better loop compensation.

Figure 5:
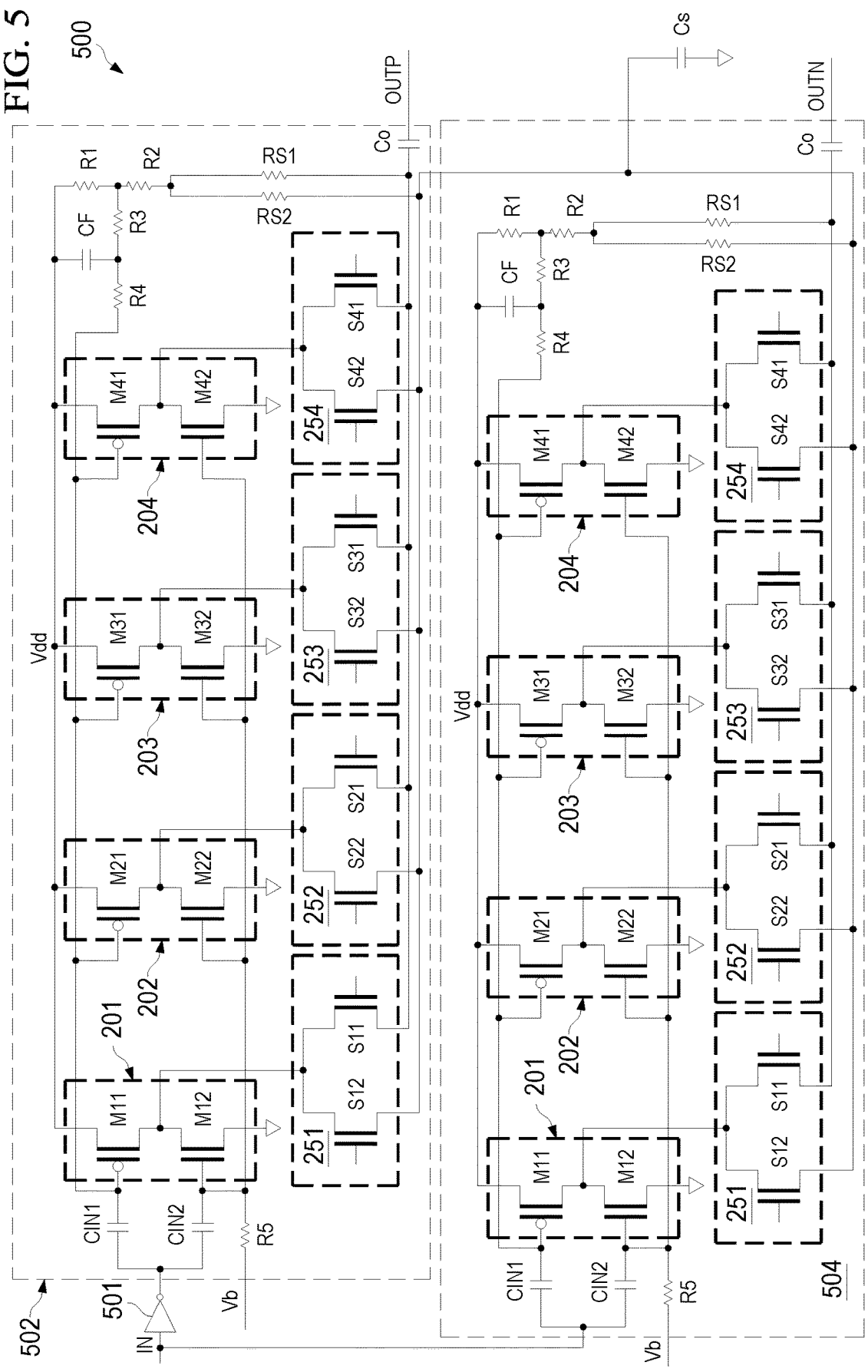
FIG. 5 illustrates a schematic diagram of a third implementation of the programmable gain amplifier shown in FIG. 1 in accordance with various embodiments of the present disclosure.

FIG. 5 illustrates a schematic diagram of a third implementation of the programmable gain amplifier shown in FIG. 1 in accordance with various embodiments of the present disclosure. The programmable gain amplifier 500 is a differential implementation of the programmable gain amplifier 300 shown in FIG. 3. As shown in FIG. 5, the programmable gain amplifier 500 includes a non-inverting phase path 502 and an inverting phase path 504. Both the non-inverting phase path 502 and the inverting phase path 504 have a structure similar to that shown in FIG. 3 except the shunt capacitor Cs can be shared by the non-inverting phase path 502 and the inverting phase path 504.

As shown in FIG. 5, the input signal of the programmable gain amplifier 500 is not applied to the input of the non-inverting phase path 502 directly. Instead, the input signal passes through an inverter 501. After passing through the inverter 501, the input signal is converted into a signal that is phase-shifted by 180 degrees relative to its input and fed into the input of the non-inverting phase path 502. The input signal of the programmable gain amplifier 500 is applied to the input of the inverting phase path 504 directly.

As shown in FIG. 5, the non-inverting phase path 502 comprises a plurality of first gain stages (e.g., 201-204 and 251-254 in the upper portion of FIG. 5) connected in parallel between the bias voltage Vdd and ground. Each first gain stage comprises a first amplification portion (e.g., 201 in the upper portion of FIG. 5) and a first current steering portion (e.g., 251 in the upper portion of FIG. 5).

The first current steering portion of the non-inverting phase path 502 is configured to send an output signal of the first amplification portion to either a first output signal path or ground through a shunt device. In particular, when the current steering switch S11 is turned on, the output signal of the first amplification portion 201 is sent to the first output signal path. The first output signal path is between the output of the first amplification portion 201 and a first output terminal OUTP. On the other hand, when the current steering switch S12 is turned on, the output signal of the first amplification portion 201 is sent to ground through a low impedance shunt capacitor Cs. It should be noted that the current steering switches S11 and S12 are controlled by two complementary gate drive signals.

In some embodiments, the amplification portions of the non-inverting phase path 502 are implemented as a plurality of binary-weighted amplification portions connected in parallel. The plurality of binary-weighted amplification portions have gain values corresponding to a predetermined number of binary bits having a range from a least significant bit to a most significant bit. For example, the gains of the amplification portions 201, 202, 203 and 204 of the non-inverting phase path 502 have a ratio of 8:4:2:1.

In some embodiments, the non-inverting phase path 502 also comprises a plurality of binary-weighted current steering portions connected to their corresponding binary-weighted amplification portions, respectively. More particularly, each of the plurality of binary-weighted current steering portions has current steering capability proportional to a gain of a corresponding binary-weighted amplification portion.

The inverting phase path 504 comprises a plurality of second gain stages (e.g., 201-204 and 251-254 in the lower portion of FIG. 5) connected in parallel between the bias voltage Vdd and ground. Each second gain stage comprises a second amplification portion (e.g., 201 in the lower portion of FIG. 5) and a second current steering portion (e.g., 251 in the lower portion of FIG. 5).

The second current steering portion is configured to send an output signal of the second amplification portion to either a second output signal path or ground through the shunt device Cs. In particular, when the current steering switch S11 (lower portion of FIG. 5) is turned on, the output signal of the second amplification portion is sent to the second output signal path. The second output signal path is between the output of the second amplification portion and a second output terminal OUTN. On the other hand, when the current steering switch S12 (lower portion of FIG. 5) is turned on, the output signal of the second amplification portion is sent to ground through the low impedance shunt capacitor Cs.

It should be noted that the inverting phase path 504 may comprise a plurality of binary-weighted amplification portions and binary-weighted current steering portions. The structure of the binary-weighted amplification portions and binary-weighted current steering portions of the inverting phase path 504 is similar to that of the non-inverting phase path 502, and hence is not discussed again to avoid repetition.

Figure 6:
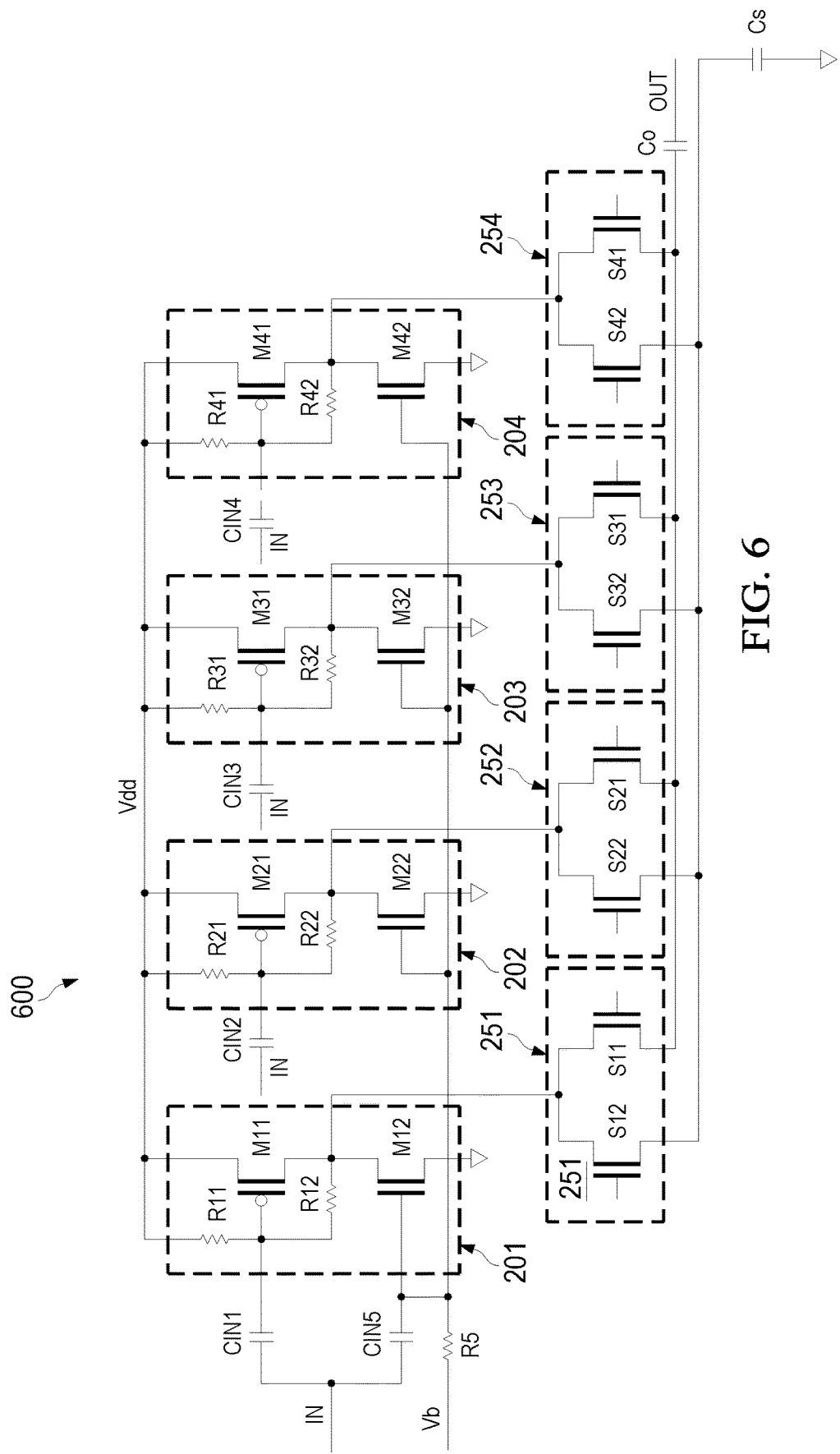
FIG. 6 illustrates a schematic diagram of a fourth implementation of the programmable gain amplifier shown in FIG. 1 in accordance with various embodiments of the present disclosure.

FIG. 6 illustrates a schematic diagram of a fourth implementation of the programmable gain amplifier shown in FIG. 1 in accordance with various embodiments of the present disclosure. The schematic diagram of the programmable gain amplifier 600 is similar to that shown in FIG. 3 except that each gain stage has a dedicated dc biasing circuit.

A first biasing circuit comprises R11 and R12. The first biasing circuit is employed to set the dc bias of the p-type transistor M11.

A second biasing circuit comprises R21 and R22. The second biasing circuit is employed to set the dc bias of the p-type transistor M21. A third biasing circuit comprises R31 and R32. The third biasing circuit is employed to set the dc bias of the p-type transistor M31. A fourth biasing circuit comprises R41 and R42. The fourth biasing circuit is employed to set the dc bias of the p-type transistor M41.

Figure 7:
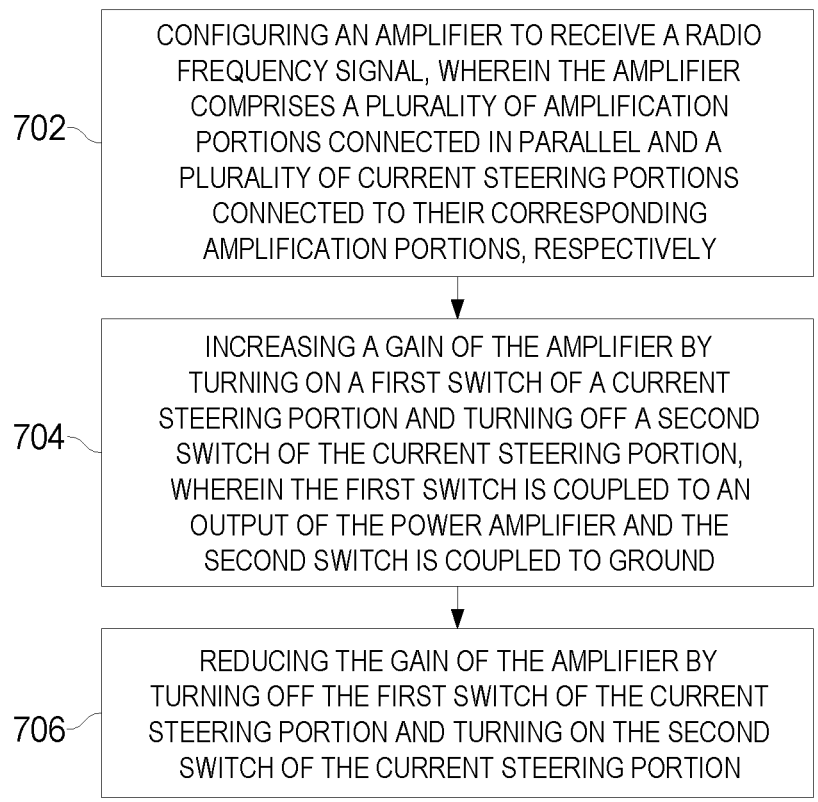
FIG. 7 illustrates a flow chart of a method for controlling the programmable gain amplifier shown in FIG. 1 in accordance with various embodiments of the present disclosure.

FIG. 7 illustrates a flow chart of a method for controlling the programmable gain amplifier shown in FIG. 1 in accordance with various embodiments of the present disclosure. This flowchart shown in FIG. 7 is merely an example, which should not unduly limit the scope of the claims. One of ordinary skill in the art would recognize many variations, alternatives, and modifications. For example, various steps illustrated in FIG. 7 may be added, removed, replaced, rearranged and repeated.

Referring back to FIGS. 1-2, the receiver 101 comprises a programmable gain amplifier 106. The programmable gain amplifier 106 comprises a plurality of gain stages connected in parallel between a first bias voltage and ground. In some embodiments, each gain stage comprises an amplification portion and a current steering portion.

The amplification portion comprises a first transistor and a second transistor connected in series between the first bias voltage and ground. The first transistor is a p-type transistor. The second transistor is an n-type transistor. A gate of the first transistor and a gate of the second transistor are configured to receive an input signal through a first input capacitor and a second input capacitor, respectively.

The current steering portion comprises a first signal path and a second signal path. The first signal path is connected between an output of the amplification portion and a signal output terminal of the programmable gain amplifier 106. The second signal path is connected between the output of the amplification portion and ground through a shunt capacitor.

The first signal path comprises a first current steering switch connected between the output of the amplification portion and the signal output terminal of the programmable gain amplifier 106. There may be an ac coupling capacitor placed in the first signal path.

The second signal path comprises a second current steering switch connected between the output of the amplification portion and ground through a shunt capacitor. A gate of the first current steering switch and a gate of the second current steering switch are configured to receive two complementary gate drive signals.

At step 702, an amplifier is configured to receive a radio frequency signal. In some embodiments, the amplifier is a transconductance amplifier comprising a plurality of amplification portions connected in parallel and a plurality of current steering portions connected to their corresponding amplification portions, respectively.

At step 704, a gain of the amplifier is increased by turning on a first switch of a current steering portion and turning off a second switch of the current steering portion. The first switch is coupled between an output of an amplification portion and an output of the amplifier. The second switch is coupled between the output of the amplification portion and ground.

At step 706, the gain of the amplifier is reduced by turning off the first switch of the current steering portion and turning on the second switch of the current steering portion.

Figure 8:
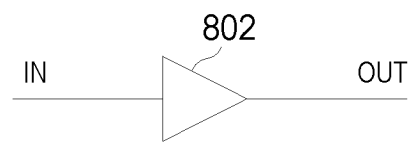
FIG. 8 illustrates a programmable gain amplifier in accordance with various embodiments of the present disclosure.

FIG. 8 illustrates a programmable gain amplifier in accordance with various embodiments of the present disclosure.

The programmable gain amplifier 802 is a front-end transconductance amplifier used in signal paths of radio frequency integrated circuits. The programmable gain amplifier 802 is employed to convert a radio frequency voltage signal IN to a radio frequency current signal OUT for driving a passive mixer and transimpedance amplifiers. The programmable gain amplifier 802 is required to have an adjustable gain for accommodating a wide range of radio frequency input voltage signals.

In order to have an adjustable gain, the programmable gain amplifier 802 may be implemented as the programmable gain amplifier 300 shown in FIG. 3, the programmable gain amplifier 400 shown in FIG. 4, the programmable gain amplifier 500 shown in FIG. 5, the programmable gain amplifier 600 shown in FIG. 6 or any combinations thereof.

In some embodiments, the programmable gain amplifier 802 may be used in a receiver as shown in FIG. 1. In alternative embodiments, the programmable gain amplifier 802 may be used in a transmitter for driving an antenna. Moreover, the programmable gain amplifier 802 may be used in various wireless communication systems such as mobile phones, base stations and the like.

Figure 9:
FIG. 9 illustrates a controller for controlling the operation of the programmable gain amplifier in accordance with various embodiments of the present disclosure.

FIG. 9 illustrates a controller for controlling the operation of the programmable gain amplifier in accordance with various embodiments of the present disclosure. The controller 902 is employed to control the operation of the programmable gain amplifier (e.g., amplifier 106 shown in FIG. 2). The controller 902 may be implemented as any suitable control devices such as a digital signal processor (DSP) chip, a microcontroller, a control unit of a central processing unit and/or the like.

As shown in FIG. 9, the controller 902 has three inputs. A first input is configured to receive the radio frequency voltage signal IN. A second input is configured to receive the radio frequency current signal OUT. A third input is configured to receive a predetermined system control signal CONTROL. Based upon the received signals IN, OUT and CONTROL, the controller 902 is able to generate a plurality of gate drive signals for controlling the on/off of the switches S11, S12, S21, S22, S31 and S32.

Figure 10:
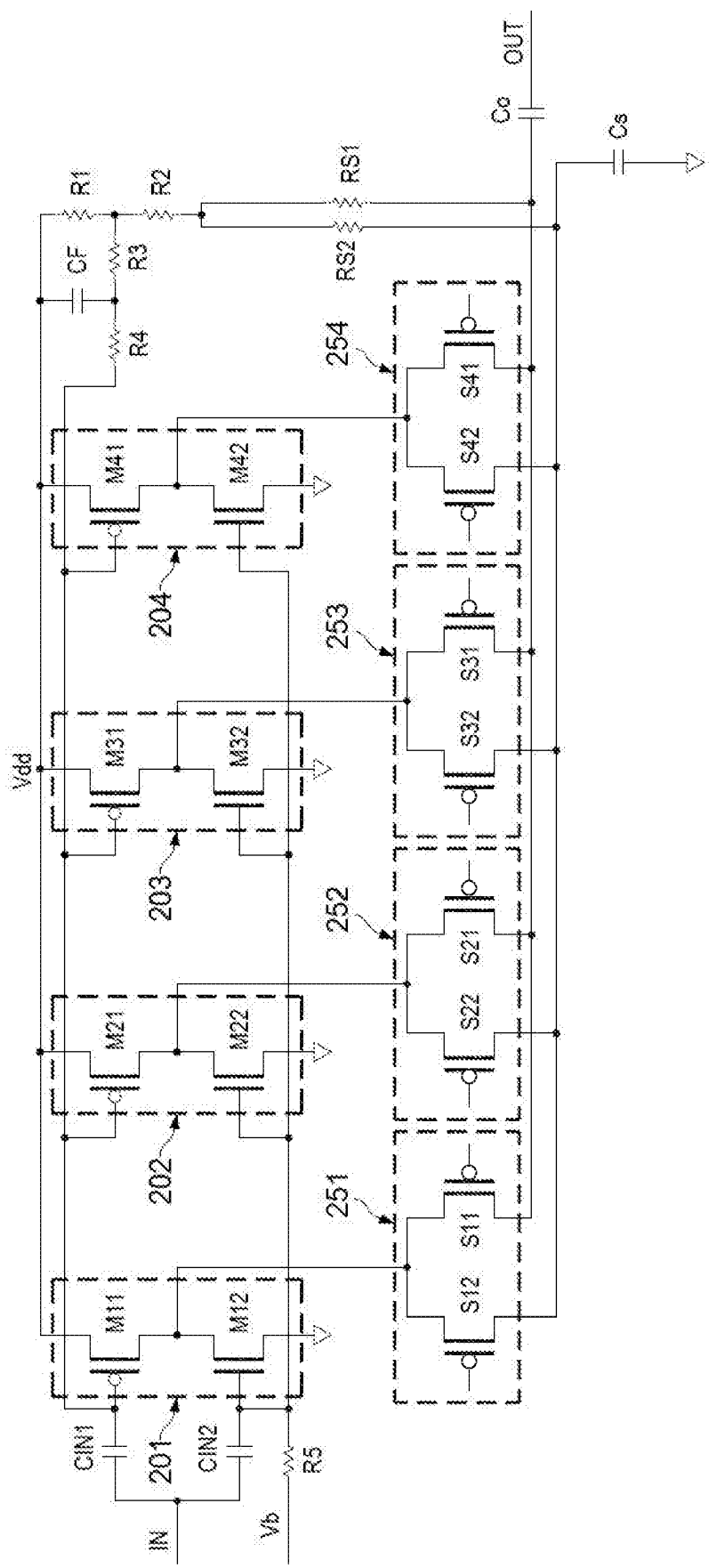
FIG. 10 illustrates a schematic diagram of another implementation of the programmable gain amplifier shown in FIG. 1 in accordance with various embodiments of the present disclosure.

FIG. 10 illustrates a schematic diagram of another implementation of the programmable gain amplifier shown in FIG. 1 in accordance with various embodiments of the present disclosure. The programmable gain amplifier shown in FIG. 10 is similar to the programmable gain amplifiers described above except that the current steering portion includes p-type transistors.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An apparatus comprising:
a plurality of selectable gain stages connected in parallel between a first supply voltage and ground, wherein each selectable gain stage comprises an amplification portion and a current steering portion, and wherein the current steering portion comprises:
  a first selectable signal path connected between an output of the amplification portion and a signal output terminal; and
  a second selectable signal path connected between the output of the amplification portion and ground through a shunt device.

2. The apparatus of claim 1, wherein the amplification portion comprises:
a first transistor and a second transistor connected in series between the first supply voltage and ground.

3. The apparatus of claim 2, wherein:
the first transistor is a p-type transistor; and
the second transistor is an n-type transistor, wherein a gate of the first transistor and a gate of the second transistor receive an input signal through a first input capacitor and a second input capacitor, respectively.

4. The apparatus of claim 1, wherein the current steering portion comprises a first current steering switch and a second current steering switch, and wherein:
a first drain/source terminal of the first current steering switch and a first drain/source terminal of the second current steering switch are connected to the output of the amplification portion;
a second drain/source terminal of the first current steering switch is connected to the signal output terminal; and
a second drain/source terminal of the second current steering switch is connected to ground through a shunt capacitor.

5. The apparatus of claim 4, wherein:
a gate of the first current steering switch and a gate of the second current steering switch are controlled by two complementary gate drive signals.

6. The apparatus of claim 1, further comprising:
a bias circuit for setting a dc bias point at the signal output terminal, wherein the bias circuit comprises a resistor divider, a first sense resistor and a second sense resistor, and wherein:
  the first sense resistor is connected to the first selectable signal path;
  the second sense resistor is connected to the second selectable signal path; and
  the resistor divider is connected between the first supply voltage and a common node of the first sense resistor and the second sense resistor.

7. The apparatus of claim 1, further comprising:
a bias resistor connected between a second supply voltage and the amplification portion, wherein the second supply voltage and the bias resistor provide a bias current for the amplification portion.

8. A system comprising:
an inverting phase path comprising a plurality of first gain stages connected in parallel between a first voltage and a second voltage, wherein each first gain stage comprises a first amplification portion and a first current steering portion, and wherein the first current steering portion sends an output signal of the first amplification portion to either a first output signal path or ground through a shunt device; and a non-inverting phase path comprising a plurality of second gain stages connected in parallel between the first voltage and the second voltage, wherein each second gain stage comprises a second amplification portion and a second current steering portion, and wherein the second current steering portion sends an output signal of the second amplification portion to either a second output signal path or ground through the shunt device.

9. The system of claim 8, wherein:
the second voltage is of a ground voltage potential; and
the first voltage is of a voltage potential greater than the second voltage.

10. The system of claim 8, further comprising:
a bias circuit for setting a first bias point at a signal output terminal of the first output signal path and a second bias point at a signal output terminal of the second output signal path, wherein the bias circuit comprises a first resistor divider, a second resistor divider, a first sense resistor, a second sense resistor, a third sense resistor and a fourth sense resistor, and wherein:
the first sense resistor and the second sense resistor are connected to the first output signal path and the shunt device, respectively;
the third sense resistor and the fourth sense resistor are connected to the second output signal path and the shunt device, respectively;
the first resistor divider is connected between the first voltage and a common node of the first sense resistor and the second sense resistor; and
the second resistor divider is connected between the first voltage and a common node of the third sense resistor and the fourth sense resistor.

11. The system of claim 8, further comprising:
an inverter connected between an input signal terminal and the non-inverting phase path, wherein the inverting phase path is connected to the input signal terminal directly.

12. The system of claim 8, wherein:
the inverting phase path comprises a plurality of binary-weighted first amplification portions connected in parallel, and wherein the plurality of binary-weighted first amplification portions has gain values corresponding to a predetermined number of binary bits having a range from a least significant bit to a most significant bit.

13. The system of claim 12, wherein:
the inverting phase path comprises a plurality of binary-weighted first current steering portions connected to their corresponding binary-weighted first amplification portions, respectively, and wherein each of the plurality of binary-weighted first current steering portions has current steering capability proportional to the gain of the corresponding binary-weighted first amplification portion.

14. A method comprising:
receiving a radio frequency signal by an amplifier, wherein the amplifier comprises a plurality of amplification portions connected in parallel and a plurality of current steering portions connected to their corresponding amplification portions, respectively;
increasing a gain of the amplifier by turning on a first switch of a current steering portion and turning off a second switch of the current steering portion, wherein the first switch is coupled to an output of the amplifier and the second switch is coupled to ground; and
reducing the gain of the amplifier by turning off the first switch of the current steering portion and turning on the second switch of the current steering portion.

15. The method of claim 14, further comprising:
receiving the radio frequency signal by a non-inverting phase path of the amplifier through an inverter; and
receiving the radio frequency signal directly by an inverting phase path of the amplifier, wherein the inverting phase path and the non-inverting phase path have a similar circuit structure and share a shunt capacitor connected to ground.

16. The method of claim 15, wherein:
the inverting phase path comprises a plurality of first gain stages connected in parallel between a supply voltage and ground, wherein each first gain stage comprises a first amplification portion and a first current steering portion, and wherein the first current steering portion has a first current steering switch connected to a first output of the amplifier, and a second current steering switch connected to ground through the shunt capacitor; and
the non-inverting phase path comprises a plurality of second gain stages connected in parallel between the supply voltage and ground, wherein each second gain stage comprises a second amplification portion and a second current steering portion, and wherein the second current steering portion has a third current steering switch connected to a second output of the amplifier, and a fourth current steering switch connected to ground through the shunt capacitor.

17. The method of claim 16, wherein:
each amplification portion of the plurality of amplification portions comprises a first transistor and a second transistor connected in series between the supply voltage and ground.

18. The method of claim 17, wherein:
a first drain/source terminal of the first current steering switch and a first drain/source terminal of the second current steering switch are connected to the output of the amplification portion;
a second drain/source terminal of the first current steering switch is connected to the first output of the amplifier; and
a second drain/source terminal of the second current steering switch is connected to ground through the shunt capacitor.

19. The method of claim 14, further comprising:
providing a bias current for the plurality of amplification portions through a single bias circuit.

20. The method of claim 19, further comprising:
providing a dc set point for the output of the amplifier through two sense resistors connected to the single bias circuit.

* * * * *